United States Patent [19]

Diamand et al.

[11] 4,249,149
[45] Feb. 3, 1981

[54] ULTRA HIGH-FREQUENCY CIRCUIT WITH RESONANT CAVITY EQUIPPED WITH PAIRS OF PERIPHERAL DIODES

[75] Inventors: Félix Diamand; Guy Bourrabier; Robert Antoine, all of Paris, France

[73] Assignee: Thomson-CSF, Paris, France

[21] Appl. No.: 34,735

[22] Filed: Apr. 30, 1979

[30] Foreign Application Priority Data

May 3, 1978 [FR] France ............................. 78 13091

[51] Int. Cl.³ ........................... H01P 7/04; H01P 7/06
[52] U.S. Cl. ................................. 333/223; 330/287; 331/102; 331/107 P; 331/107 DP; 333/231
[58] Field of Search ............... 333/217, 223, 227, 231, 333/235; 331/96, 102, 107 P, 107 DP; 330/56, 286, 287

[56] References Cited

U.S. PATENT DOCUMENTS

| 3,401,355 | 9/1968 | Kafitz | 331/107 DP |
| 4,056,784 | 11/1977 | Cohn | 330/287 |
| 4,066,988 | 1/1978 | Karp | 333/231 X |

Primary Examiner—Paul L. Gensler
Attorney, Agent, or Firm—Oblon, Fisher, Spivak, McClelland & Maier

[57] ABSTRACT

A circuit capable of providing the negative resistance heart of oscillators or amplifiers in the 5-20 Gc/s frequency band, comprising a central resonant cavity and one or several peripheral exciting chambers, each containing a push-pull arrangement of two diodes for example three pairs of diodes in chambers arranged at 120° from one another on a circle concentric to the central cavity. The diodes are located at the bottoms of cylindrical exciting chambers communicating with the central chamber through holes situated at the center of each push-pull arrangement. Each pair of diodes is maintained and polarized by a metallic bar which plays, with the walls of the exciting chamber, the role of an impedance transformer between the diodes and the central cavity. The metallic bar is maintained by a polarization rod penetrating the chamber through an insulating passage.

7 Claims, 7 Drawing Figures

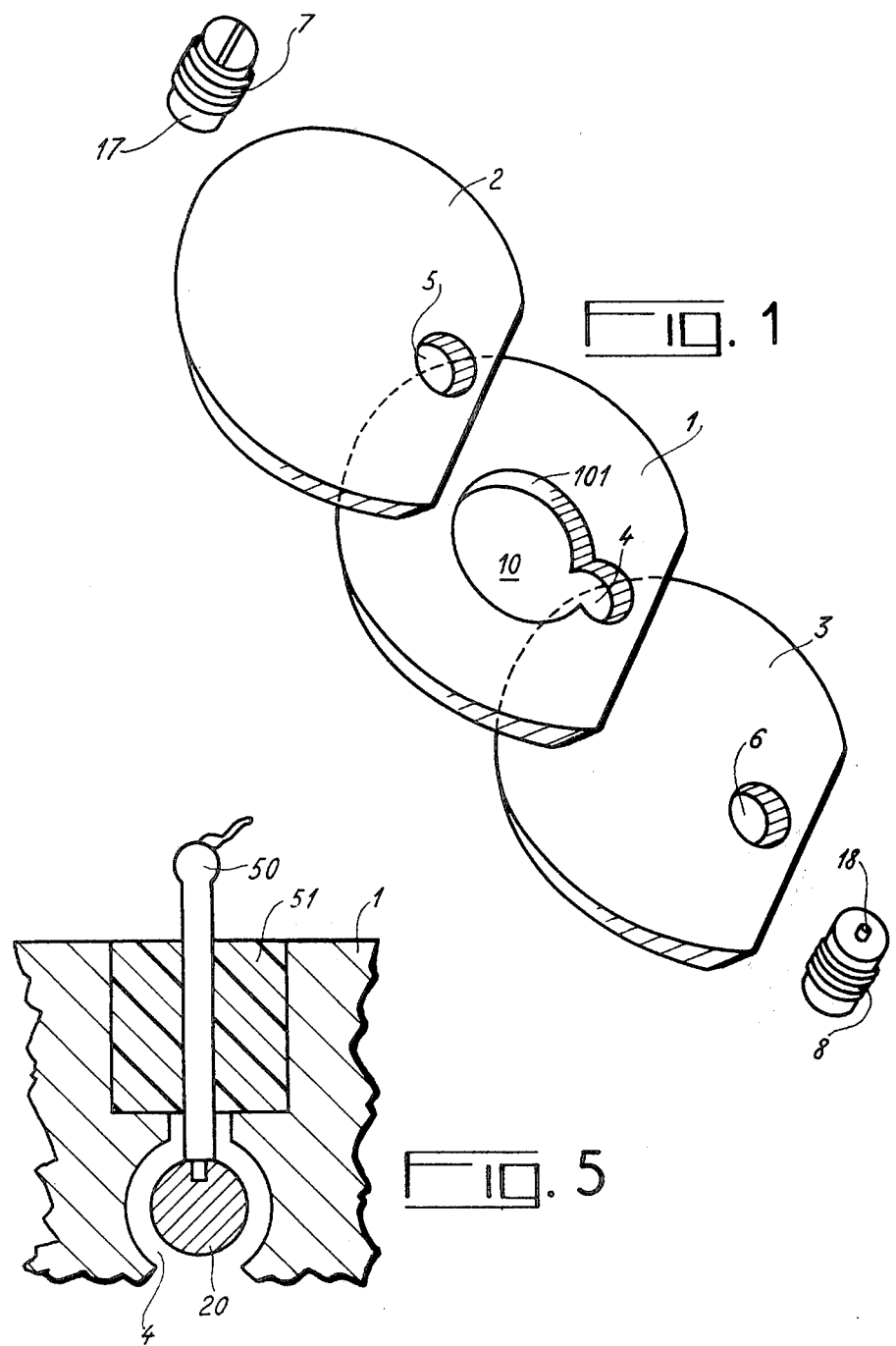

ULTRA HIGH-FREQUENCY CIRCUIT WITH RESONANT CAVITY EQUIPPED WITH PAIRS OF PERIPHERAL DIODES

The invention relates to a circuit capable of functioning as a negative resistance device in the range of ultra high-frequency elecromagnetic waves (over 1 GHz) with an output combining at least that of a pair of diodes coupled to a resonant cavity.

Devices have been proposed, comprising diodes placed on the periphery of a cylindrical resonant cavity. These diodes are mounted on the end of a coaxial line coupled to the cavity, the other end being terminated by a dissipative load, which stabilises operation but has the drawback of reducing the output.

In the present invention, the diodes are mounted in pairs, causing them to function on a push-pull basis. By overcoming certain difficulties, better efficiency is obtained, while the source remains small in size for a given output rating.

In accordance with the invention, there is provided an ultra high-frequency circuit comprising a resonant cavity and, on the periphery of the same, at least one exciting chamber communicating with the interior of said cavity, each exciting chamber comprising a pair of diodes, arranged head-to- tail, between which a central conductor defines with the walls of said exciting chamber a section of coaxial cable, said central conductor being used as a connection for the polarization of the two diodes.

The invention will be more easily understood and other features will become apparent from the following description and with reference to the accompanying drawings, wherein:

FIG. 1 is an exploded view showing a simplified perspective view of a resonant cavity and a cylindrical chamber in communication therewith, as well as two plugs, each provided with a diode, according to a form of embodiment of the invention;

FIG. 5 is a detailed cross-section of a polarizing device that is equivalent to the one shown in FIG. 3.

Figure 2A:
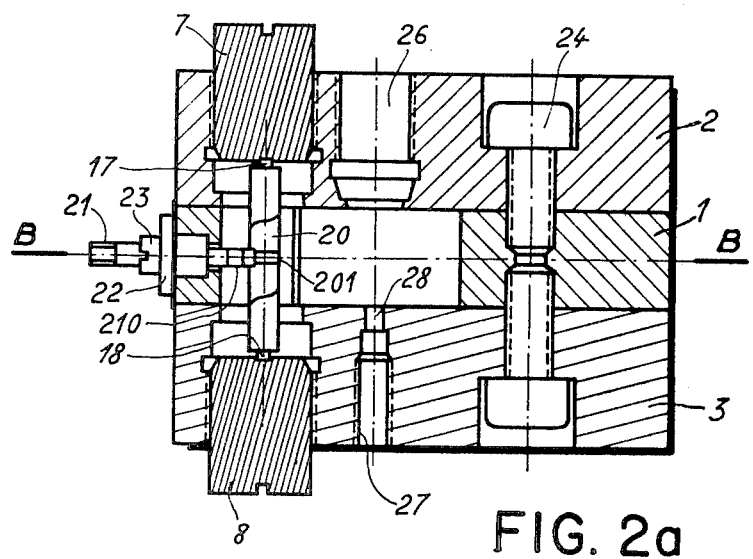
FIGS. 2a and 2b show two schemtically represented cross-sections along two normal planes of a form of embodiment of the invention containing only one pair of diodes.

In order to bring out the main features of the invention as clearly as possible, FIG. 1 represents five elements of a demountable assembly delimiting, when assembled, the central cavity and a lateral chamber (one only in this embodiment) provided with diodes.

A copper unit 1, constituting the central element, comprises a central orifice 10 whose cylindrical wall defines the diameter of the resonant cavity and, practically speaking, the operating frequency of the circuit: for example, a diameter of 14 mm for a frequency of 16 GHz. The wall 101 opens into a bore 4 whose diameter is smaller than that of orifice 10, which thus communicates with bore 4. The thickness of said unit is not rigorously stipulated and, in the above example, can be 8 mm, which defines the height of the cylinder constituting the central cavity.

Two analogous units 2 and 3 have the same longitudinal dimensions, the same external contour and are somewhat thicker, for example 12 mm. They do not comprise a central bore; unit 2 has an orifice 5, designed to form an extension to the bore 4 and, symmetrically therewith, unit 3 has an orifice 6.

Orifices 4 and 6 are tapped in order to be able to receive two plugs 7 and 8 bearing threads corresponding to those of said orifices. Diodes, 17 and 18, are soldered to the centre of the internal face of each plug. The system whereby said diodes receive polarisation has not been represented.

Figure 2B:
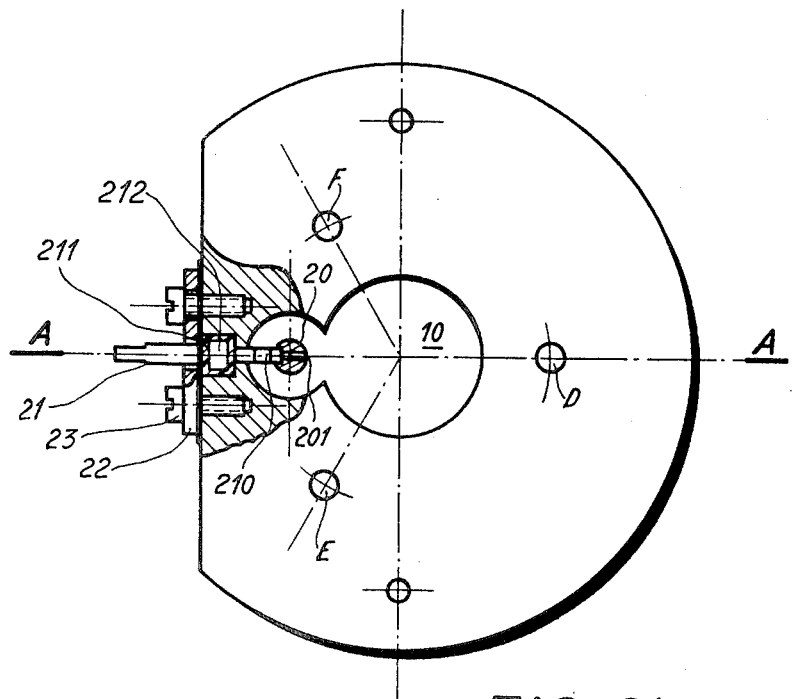

FIG. 2 represents, in (a), a cross-section along a trace line AA of section (b); conversely, (b) represents a cross section along a trace line BB of section (a). Here, we see the assembly of the units, 1, 2 and 3, already shown in FIG. 1, as well as the plugs, 7 and 8, bearing diodes 17 and 18. The following are also illustrated:

the central conductor of the lateral chamber formed by alignment of orifices 3, 4 and 5, said conductor taking the shape of a bar 20, whose centre has been machined as shown by cut-away section in (a) and accommodates the end 201 of a polarising rod 21, which ensures that the bar 20 is positioned and maintained in contact with diodes 17 and 18;

a polarising input device comprising the rod 21, already mentioned, a flange 22 and screws 23 attached to unit 1;

an output 26, for a coaxial aerial (not illustrated);

an aperture 28 enabling insertion of a dielectric screw (not illustrated) on thread 27 and opposite the coaxial aerial;

screws 24, ensuring the assembly of units 2 and 3 to unit 1 at the three apices, D, E and F, of an equilateral triangle.

Rod 21 is interrupted by a silicon resistor 210, designed to attenuate parasitic operation of the circuit. In the form of embodiment in FIG. 2, rod 21 is held inside unit 1 by a flange 22, bearing on a collar 212, of rod 21, said collar being insulated by an insulating layer 211.

Figure 3:
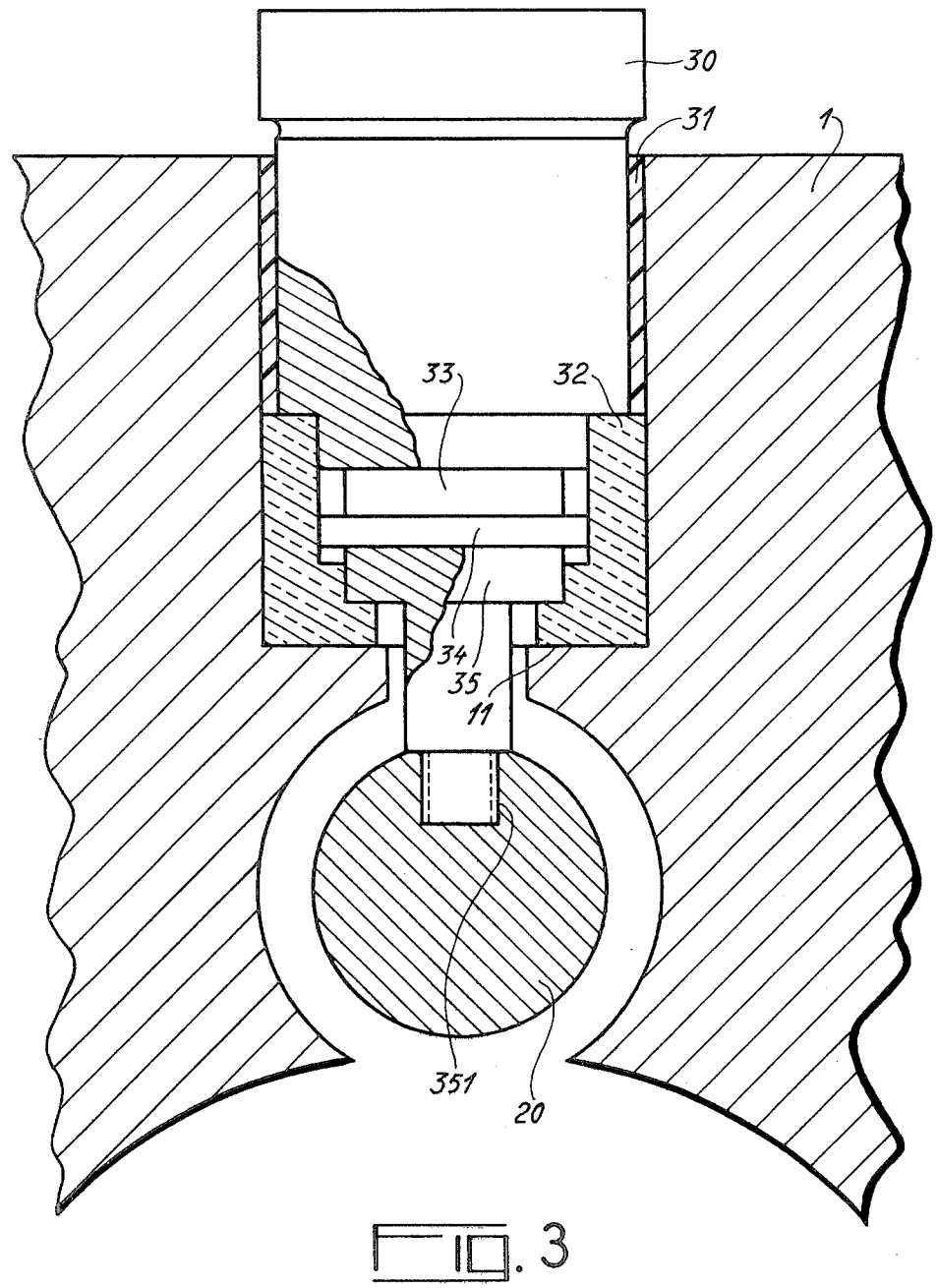
FIG. 3 is a detailed cross-section of an alternative form of an element of the embodiment represented in FIG. 2.

FIG. 3 shows an alternative form of embodiment of the polarising rod comprising two copper portions 30 and 35, separated by a silicon disc 33, and a rubber, electrically conductive buffer 34. The insulation between the rod and unit 1 is first of all provided by a first sleeve 31, for example of polytetrafluoroethylene, which extends to a certain depth in a matching housing in block 1. Then, to complete insulation and ensure mechanical strength, a second sleeve 32, of aluminium oxide for example, retained by a stop 11, in unit 1 is provided. The copper portion 35 of the polarising rod is machined so as to have ever-decreasing diameters down to an extremity 351, bearing a thread designed to enable extremity 351 to be screwed into bar 20.

An equivalent device (as regards attenuation at ultra high-frequency) is represented in FIG. 5, wherein a polarising rod 50 is surrounded, when passing through the unit 1, by dielectric filled with a resistive substance (for example carbon cracked aluminium oxide). The energy losses occur solely at high frequency, without affecting the d.c. current, thus giving the circuit excellent overall efficiency.

Figure 4A:
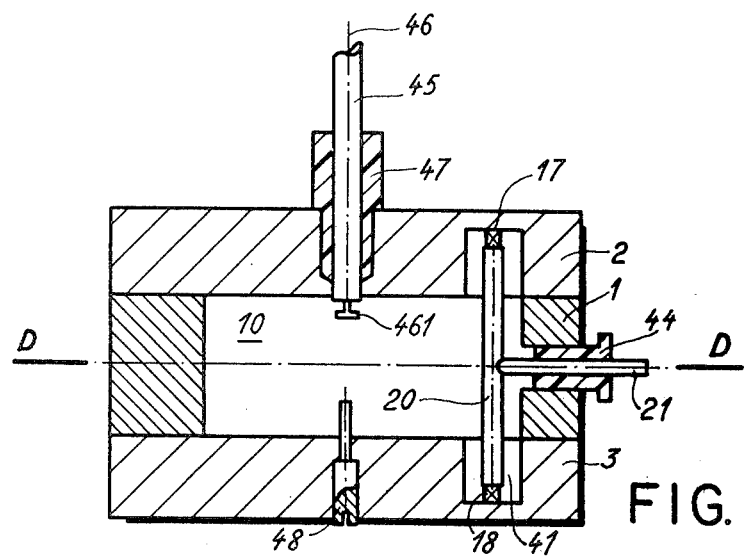
FIGS. 4a and 4b represent two cross-sections, along two normal planes, of a form of embodiment of the invention comprising three pairs of diodes.
Figure 4B:
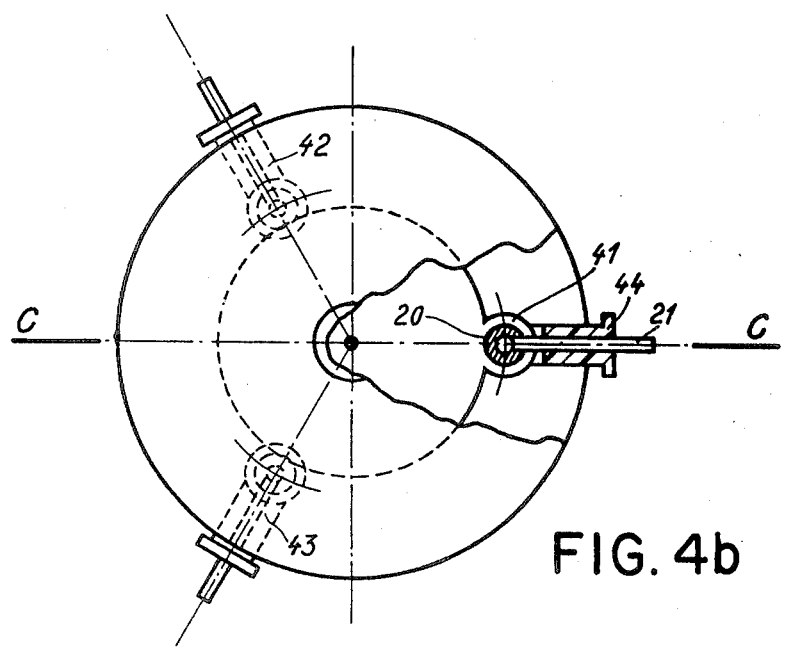

FIG. 4 shows a circuit according to the invention comprising three pairs of diodes placed in lateral chambers 41, 42 and 43, arranged at 120° from one another on a circle concentric to central cavity 10. (a) is a cross-section along a trace plane CC of part (b) of FIG. 4, said trace passing along the axis of polarising rod 21 of chamber 41. The drawing has been simplified by omitting the supporting plugs of diodes 17 and 18. The same applies to the top view in FIG. 4 (b) as regards the supporting plugs of the diodes allotted to chambers 42 and 43. The means of transmitting polarisation to chamber 41, which is visible only in FIG. 4 (b), by means of a cut-away portion, is symbolically represented simply by the rod 21 insulated by a sleeve 44 and by the bar 20 supporting the diodes 17 and 18, shown here as if they were soldered to the body of units 2 and 3, and not to their supporting plugs.

An output of coaxial aerial 45, insulated by a sleeve 47, is represented in a simplified form; the central conductor 46 of the solid dielectric coaxial cable is bared in the portion of the cable projecting into cavity 10. A small disc 461 is soldered to the end of conductor 46 to act as a wave collector in the cavity. Finally, a dielectric screw 48, projects into the cavity opposite to the coaxial aerial.

Among the important parameters of the circuit according to the invention, mention can be made, in addition to the diameter of the main cavity, of:

the dimensions of the transformer constituted by the conductor 20 and the lateral chamber whose axis is occupied by it, that is to say the length and diameter of the cylinder in question; the optimum values of these parameters depend on the impedance of the diodes (which are identical with one another insofar as possible) with which each lateral chamber is fitted; these dimensions can be determined by calculation and verified by experiment;

the value of resistance 210, which is in the order of a few ohms.

In the example described above, and illustrated in FIG. 2, the parameter values are as follows:
diameter of the main cavity: 14 mm;
diameter of the lateral chamber: 7 mm.

The function of resistor 210 is to make the symmetrical oscillator mode of the diodes evanescent, thus promoting the anti-symmetrical mode, which is the only mode suitable for transmitting high frequency power to the coaxial aerial output.

Optimisation of the source output rating is a function both of the structure of the transformer and of the coupling of the wave collector (varying depth of the conductor 46 and of the disc 461 (FIG. 4a).

The invention can be applied to oscillators and amplifiers operating at very high frequencies, in particular in the 5 to 20 GHz band.

In said applications, the oscillator device or the amplifier constitutes a negative resistance dipole, mounted, for example, on the terminals of a circulator.

What is claimed is:

1. An ultra high-frequency circuit comprising a resonant cavity and, on the periphery of the same, at least one exciting chamber communicating with the interior of said cavity, said at least one exciting chamber comprising a pair of diodes, arranged head-to-tail, between which a central conductor defines with the walls of said exciting chamber a section of coaxial cable, said section having an opening providing access to the resonant cavity, said central conductor being used as a connection for the polarization of the two diodes.

2. Circuit according to claim 1, wherein the resonant cavity and the exciting chamber are portions of cylinders with parallel axes.

3. Circuit according to claim 1, wherein the central conductor is a metallic bar fixed to the end of a rod penetrating the chamber through an insulating passage, said rod serving, with the central conductor, as a polarization connection.

4. Circuit according to claim 3, wherein the polarization rod has an intermediate portion of a material with a substantial degree of electric resistivity.

5. Circuit according to claim 4, further including an insulating sleeve enclosed in a wall of the exciting chamber and serving to retain an electrically conductive rubber ring inserted into the polarization rod.

6. Circuit according to claim 3, wherein the polarizing rod is surrounded, in its passage through the wall of the exiciting chamber, by a dielectric having considerable ultra high-frequency losses.

7. Circuit according to claim 1, comprising three exciting chambers, each provided with a pair of diodes, centred on three planes passing through the axis of the main cylinder, located, in relation to one another, at an angle of 120° degrees, said three chambers communicating with said cavity.

* * * * *